(12) United States Patent
Harikai et al.

(10) Patent No.: US 11,830,758 B2
(45) Date of Patent: Nov. 28, 2023

(54) PLASMA PROCESSING METHOD

(71) Applicant: Panasonic Intellectual Property Management Co., Ltd., Osaka (JP)

(72) Inventors: Atsushi Harikai, Osaka (JP); Shogo Okita, Hyogo (JP); Akihiro Itou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 93 days.

(21) Appl. No.: 17/456,908

(22) Filed: Nov. 30, 2021

(65) Prior Publication Data
US 2022/0181188 A1 Jun. 9, 2022

(30) Foreign Application Priority Data

Dec. 3, 2020 (JP) ................................. 2020-201197

(51) Int. Cl.
*H01L 21/3065* (2006.01)
*H01L 21/683* (2006.01)
*H01J 37/32* (2006.01)

(52) U.S. Cl.
CPC .... *H01L 21/6836* (2013.01); *H01J 37/32495* (2013.01); *H01J 37/32862* (2013.01); *H01L 21/3065* (2013.01)

(58) Field of Classification Search
CPC ............ H01L 21/3065; H01J 37/32495; H01J 37/23862
See application file for complete search history.

(56) References Cited

U.S. PATENT DOCUMENTS

| | | | |
|---|---|---|---|
| 6,846,424 B2* | 1/2005 | Baum | C30B 25/02 216/75 |
| 2003/0209518 A1* | 11/2003 | Liao | H01J 37/32935 216/59 |
| 2004/0157064 A1* | 8/2004 | Aoki | C09J 183/04 428/447 |

(Continued)

FOREIGN PATENT DOCUMENTS

JP 2019-160883 A 9/2019

OTHER PUBLICATIONS

Loewenstein, Lee M., et al., "Effect of oxygen on fluorine-based remote plasma etching of silicon and silicon dioxide". J. Vac. Sci. Technol. A 6 (3), May/Jun. 1988, pp. 1984-1988.*

(Continued)

*Primary Examiner* — Bret P Chen
(74) *Attorney, Agent, or Firm* — PEARNE & GORDON LLP

(57) ABSTRACT

A plasma processing method including: a process of placing a work piece on a stage provided in a chamber, the work piece including a substrate and a holding member having an adhesive layer on a surface and holding the substrate via the adhesive layer, and having an exposed portion where the adhesive layer is exposed outside the substrate; and a plasma etching process of etching the substrate with a plasma generated in the chamber, with the exposed portion exposed to the plasma. In response to occurrence of an interruption in the plasma etching process, a cleaning process of exposing a surface of the substrate to a plasma containing an oxidizing gas is performed, and then the plasma etching process is resumed.

9 Claims, 3 Drawing Sheets

(56) References Cited

U.S. PATENT DOCUMENTS

| | | | |
|---|---|---|---|
| 2011/0014777 A1* | 1/2011 | Haji | H01L 21/0273 |
| | | | 438/465 |
| 2011/0065276 A1* | 3/2011 | Ganguly | H01L 21/76232 |
| | | | 257/E21.257 |
| 2013/0072024 A1* | 3/2013 | Ricci | H05B 3/26 |
| | | | 257/E21.218 |
| 2017/0263462 A1* | 9/2017 | Okita | H01L 21/30655 |
| 2017/0263502 A1* | 9/2017 | Okita | H01L 21/3065 |

OTHER PUBLICATIONS

Tompkins, Brendan D., et al., "Etching and Post-Treatment Surface Stability of Track-Etched Polycarbonate Membranes by Plasma Processing Using Various Related Oxidizing Plasma Systems", Plasma Processes and Polymers, 2014, 11, 850-863.*

Huang, Runhui, et al. "Etching and Post-Treatment Surface Stability of Track-Etched Polycarbonate Membranes by Plasma Processing Using Various Related Oxidizing Plasma Systems", Advances in Resist Materials and Processing Technology XXV, ed by Clifford L. Henderson, Proc. of SPIE vol. 6923, 69232G, (2008) pp. 1-9.*

Miakonkikh, A.V., et al., "Anisotropic plasma etching of Silicon in gas chopping process by alternating steps of oxidation and etching", 2019 J. Phys.: Conf. Ser. 1243 012009, pp. 1-7.*

Huang, Shuo, et al., "Pattern dependent profile distortion during plasma etching of high aspect ratio features in SiO2", J. Vac. Sci. Technol. A38(2) Mar./Apr. 2020, 023001, pp. 1-12.*

Yang, Ryan, et al., "Real-Time Plasma Process Condition Sensing and Abnormal Process Detection", Sensors 2010, 10, 5703-5723.*

Kim, In Joong, et al., "Real-time plasma monitoring technique using incident-angle-dependent optical emission spectroscopy for computer-integrated manufacturing", Robotics and Computer-Integrated Manufacturing 52 (2018) 17-23.*

\* cited by examiner

PLASMA PROCESSING METHOD

CROSS REFERENCE TO RELATED APPLICATION

The present application is based on and claims priority under 35 U.S.C. § 119 with respect to the Japanese Patent Application No. 2020-201197 filed on Dec. 3, 2020, of which entire content is incorporated herein by reference into the present application.

TECHNICAL FIELD

The present invention relates to a plasma processing method.

BACKGROUND

As a method for dividing a substrate by dicing, plasma dicing using a plasma irradiation technique has been used. A plasma processing apparatus used for performing plasma dicing is configured, for example, as disclosed in Japanese Laid-Open Patent Publication No. 2019-160883.

In a plasma processing apparatus, a substrate is attached to a conveying carrier, and the conveying carrier is secured on a stage of the plasma processing apparatus, so that the substrate is securely placed on the stage. The conveying carrier usually includes a disc-shaped holding sheet (called a dicing tape) and a ring-shaped frame attached to the holding sheet at the periphery of the holding sheet. At the center of the holding sheet, the substrate is attached to the holding sheet, by which the substrate is secured to the conveying carrier.

The substrate subjected to plasma dicing is, for example, a semiconductor wafer. The size of semiconductor wafers has been increased over the years, and recently, wafers having a diameter of 8 inches (200 mm) and having a diameter of 12 inches (300 mm) are both mainly used.

Under such circumstances, there is an increasing demand for plasma dicing that can be performed using the same plasma processing apparatus for a plurality of kinds of wafers having different sizes.

However, when, for example, an 8-in-diameter wafer and a 12-in-diameter wafer are processed using the same plasma processing apparatus, the 8-in-diameter wafer is placed and secured to a holding sheet to which a frame for 12-in-diameter wafer is attached. At this time, the holding sheet is exposed between the frame and the wafer. When the exposed portion of the holding sheet is increased, an organic component of the adhesive layer of the holding sheet becomes more likely to scatter during plasma processing and attach to the inner wall of the chamber. The organic component attached to the inner wall of the chamber may attach again to the wafer and the like.

Especially when an error occurs during plasma processing, the wafer is to be held in a cooled state in the chamber. The component of the adhesive layer therefore tends to attach to the wafer, to contaminate the wafer.

SUMMARY

One aspect of the present invention relates to a plasma processing method, including: a process of placing, on a stage provided in a chamber, a work piece including a substrate and a holding member having an adhesive layer on a surface and holding the substrate via the adhesive layer, the work piece having an exposed portion where the adhesive layer is exposed outside the substrate; and a plasma etching process of etching the substrate with a plasma generated in the chamber, with the exposed portion exposed to the plasma, wherein in response to occurrence of an interruption in the plasma etching process, a cleaning process of exposing a surface of the substrate to a plasma containing an oxidizing gas is performed, and then the plasma etching process is resumed.

According to the present invention, in plasma processing under the situation where the adhesive layer of the holding member is likely to scatter by being exposed to plasma, even when an error occurs during the plasma processing, the contamination of the wafer can be removed and the plasma processing can be resumed.

DETAILED DESCRIPTION

Figure 1:
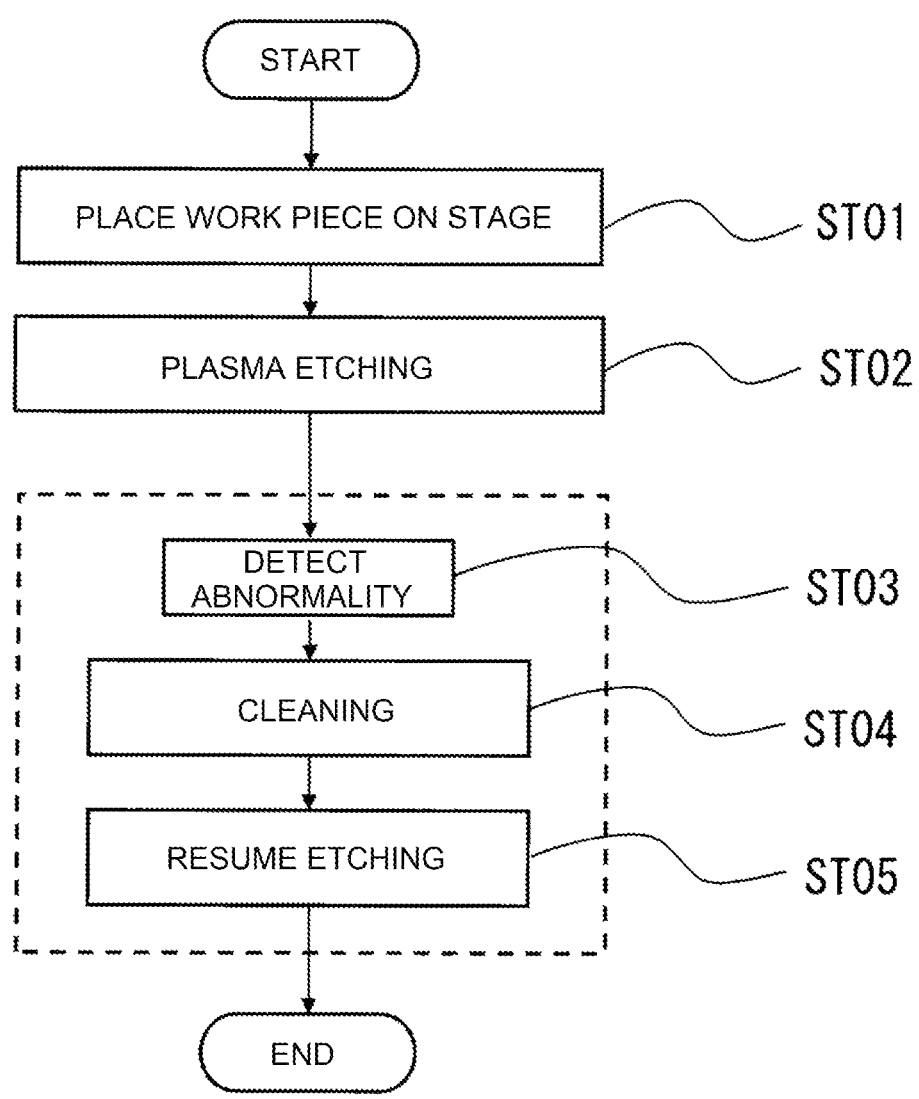
FIG. 1 is an example of a flowchart of a plasma processing method according to an embodiment of the present invention.

A plasma processing method according to an embodiment of the present invention includes: a process of placing a work piece (conveying carrier) with a substrate attached thereto, on a stage provided in a chamber; and a plasma etching process of etching the substrate with a plasma generated in the chamber. The work piece includes the substrate and a holding member holding the substrate. The holding member is a member that constitutes the work piece, such as a tape, and has an adhesive layer. The holding member is larger than the substrate. Therefore, the work piece has an exposed portion where the adhesive layer is exposed outside the substrate. When the substrate is etched while the exposed portion is exposed to the plasma, the organic component derived from the adhesive layer volatilizes and scatters within the chamber, and part of it may attach to the inner wall of the chamber.

That the holding member is larger than the substrate means that, when the substrate and the holding member are projected from a direction perpendicular to the plane direction of the substrate, the contour line of the substrate does not overlap with and is within the contour line of the holding member. The area of a region between the contour lines of the substrate and the holding member is approximately equal to the area of the exposed portion. The distance between the contour lines of the substrate and the holding member may be 10 mm or more. In this case, the area of the exposed portion is large, and the amount of the organic component to scatter within the chamber tends to increase. Also, the amount of the organic component to attach to the substrate when an abnormality occurs tends to increase.

The plasma processing method further includes a cleaning process of exposing a surface of the substrate to a plasma containing an oxidizing gas. The oxidizing gas is a gas containing oxygen or an oxygen compound, and produces a component having oxidation function, such as oxygen radicals and oxygen ions, in the plasma. In the case when, in the above plasma etching process, an interruption occurs due to an error, the cleaning process is performed and then the plasma etching process is resumed. Through the cleaning process, the organic component derived from the adhesive layer attached to the wafer is decomposed and removed. This may be followed by exhausting of the gas containing decomposition products, and other necessary processing. By doing this, the recovery of the substrate or wafer can be eased.

The material of the adhesive layer provided on the holding member is not limited, but includes, for example, at least one selected from the group consisting of an epoxy resin and an acrylic resin.

The aforementioned plasma processing method can be preferably utilized for dicing (e.g., individualization) of the substrate. Preferably, the substrate has a semiconductor layer and a mask. The semiconductor layer is provided with a plurality of element regions and a dividing region defining the element regions. The mask covers the semiconductor layer in the element regions and exposes the semiconductor layer in the dividing region. By subjecting the substrate to the plasma etching process, to etch the semiconductor layer exposed from the mask, a groove is formed along the dividing region. By forming, along the dividing region, a groove having a depth that reaches the holding member, the substrate is divided into a plurality of individual element chips having the element regions. In this case, the necessity of forming a deep groove leads to a longer processing time during which the adhesive layer is exposed to the plasma, tending to increase the scattering amount of an organic component derived from the adhesive layer, and thus to increase the amount of the organic component to attach to the substrate during the interruption of the plasma etching process. According to the plasma processing method of the present embodiment, even when the plasma etching process is interrupted during the formation of the groove, the organic component on the substrate can be effectively removed by the cleaning process, and then, the plasma etching process can be resumed. Therefore, the plasma dicing can be continued until the depth of the groove reaches the holding member.

The plasma processing method may be adopted for plasma dicing using a Bosch process. In the Bosch process, a protective film deposition step of forming a protective film on at least a sidewall of the groove formed on a substrate, a protective film removal step of removing the protective film at the bottom of the groove of the substrate, and a step of etching the bottom of the groove of the substrate are repeated in this order. By using this process, in forming a deep groove on the substrate by dicing, etching in the depth direction of the groove can be proceeded while etching in the plane direction thereof is suppressed with the protective film formed on the sidewall of the groove, and thus, a groove having a large aspect ratio (ratio of the depth to the width of the groove) can be formed.

The plasma etching process may include a process of repeatedly performing the protective film deposition step, the protective film removal step, and the step of etching the bottom of the groove, of the above-mentioned Bosch process. In this case, an interruption of the process upon detection of an abnormality, and, an issue resulting from the interruption, that is, the adhesion of an organic component derived from the adhesive layer to the substrate, may possibly occur in any one of the above three steps. However, in the cleaning process performed in response to the interruption, the organic component derived from the adhesive layer is removed, and the protective film formed on the sidewall of the groove can also be removed. Therefore, regardless of in which of the above three steps the process interruption has occurred, it is preferable to resume the Bosh process from the protective film deposition step, in the plasma etching process after the cleaning process.

In the plasma etching process, in view of suppressing the adhesion of a reaction product to the inner wall of the chamber and improving the controllability of the deposition and removal of the protective film in the Bosch process, for example, the inner wall of the chamber may be heated by a heater attached to the chamber, while the stage may be cooled by a coolant circulated in a flow channel formed in its inside. That is, the temperature of the stage on which a work piece is placed may be lower than that of the inner wall of the chamber. For example, in the plasma etching process, the difference in temperature between the stage and the inner wall of the chamber may be 50° C. or higher. When the temperature of the substrate is lower than that of the inner wall of the chamber, the adhesion of an organic component derived from the adhesive layer to the substrate during the process interruption tends to be severe. In such a case, the plasma processing method of the present embodiment including the cleaning process is effective.

In the plasma etching process, the stage may be cooled to 0° C. or lower (e.g., ~10° C.). On the other hand, in the plasma etching step, the inner wall of the chamber may be heated to 50° C. or higher (e.g., 70° C.).

A detailed description will be given below of a plasma processing method according to an embodiment of the present invention, with reference to the drawings.

FIG. 1 is a flowchart showing exemplary procedures performed in response to occurrence of an interruption during the plasma etching process, in a plasma processing method according to the embodiment of the present invention. Note that when no interruption occurs, steps ST03 and ST04 in FIG. 1 are not executed, and the processing is terminated upon completion of ST02.

In the example of FIG. 1, first, a work piece (i.e., a conveying carrier holding a substrate) is placed on a stage provided in a chamber (ST01). Then, a plasma etching process of etching the substrate with a plasma generated in the chamber is performed (ST02).

(Placement Process)
(Plasma Etching Process)

Figure 2:
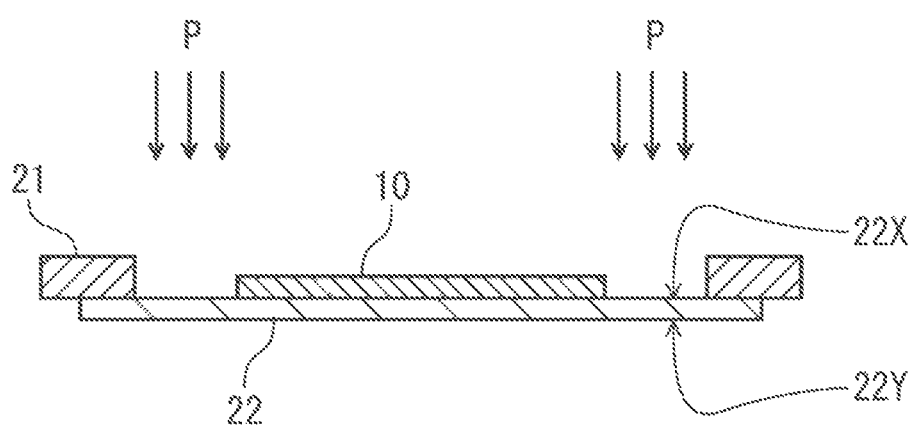
FIG. 2 is a schematic cross-sectional structure diagram of an example of a work piece used in a plasma processing method according to an embodiment of the present invention.

FIG. 2 is a cross-sectional structure diagram of an example of a work piece (i.e., a conveying carrier holding a substrate) used in the plasma processing method. A work piece 20 includes a substrate 10, a frame 21, and a sheet of holding member (dicing tape) 22. The holding member 22 is provided with an adhesive layer (not shown) on a surface 22X facing the substrate. Via the adhesive layer, one principal surface of the substrate 10 is attached to the holding member 22 at the central region of the holding member 22, so that the substrate 10 is secured to the conveying carrier. The outer periphery of the adhesive surface 22X is attached to one side of the frame 21, so that the holding member 22 is secured to the frame 21.

In the holding member 22, the material of a base material layer (non-adhesive layer) on which the adhesive layer is provided is not limited, and may be, for example, a thermoplastic resin, such as polyolefin (e.g., polyethylene, polypropylene), polyvinyl chloride, and polyester (e.g., polyethylene terephthalate). The thermoplastic resin may have a functional group that reacts during photopolymerization reaction, such as an acryl group. The thickness of the base material layer is not limited, and is, for example, 50 μm or more and 300 μm or less, preferably 50 μm or more and 150 μm or less.

The adhesive layer is preferably made of an adhesive component, the adhesive strength of which is reduced by ultraviolet (UV) irradiation. When picking up element chips after plasma dicing, the element chips can be easily peeled off from the adhesive layer by UV irradiation, which eases the pickup. The adhesive layer can be obtained by, for example, applying a UV curing acrylic adhesive or an epoxy adhesive on one side of a non-adhesive layer, in a thickness of 5 μm or more and 100 μm or less (preferably 5 μm or more and 15 μm or less).

The frame 21 is a frame member having an opening equal to or greater in area than the substrate, and has a predetermined width and a substantially constant thin thickness. The frame has such a rigidity that it can be conveyed with the dicing tape and the substrate held thereon. The shape of the opening of the frame is not limited, and may be, for example, circular, or polygonal, such as rectangular or hexagonal. The material of the frame may be, for example, a metal, such as aluminum or stainless steel, a resin, and the like.

The substrate 10 has a semiconductor layer (not shown). The semiconductor layer is provided with a plurality of element regions and a dividing region defining the element regions. The semiconductor layer in the element region is covered with a mask, while in the dividing region, the semiconductor layer is exposed. In the plasma etching process, a region of the semiconductor layer exposed in the dividing region is exposed to a plasma and etched, so that a groove is formed along the dividing region. The groove can be formed to have a depth that substantially reaches the holding member 22. As a result, the substrate 10 can be divided into a plurality of individual element chips each having one element region.

When the size (area) of the holding member 22 as seen from the sheet upper surface is sufficiently larger than the area of the substrate 10, the adhesive surface 22X is exposed between the center region of the holding member 22 where the substrate 10 is attached and the peripheral portion of the holding member 22 where the frame 21 is attached, to be exposed to a plasma. As a result, an organic component derived from the adhesive layer volatilizes in the chamber, and part of it attaches to the inner wall of the chamber and the substrate.

In the plasma etching process, a plasma processing apparatus generates a plasma by controlling a gas flow rate, a pressure, an electric power applied to the ICP coil, a bias power, and other parameters, and observes the values of these parameters. When the observed values of the parameters exceed the predetermined values, it is determined that an abnormality has occurred, and the plasma etching process is interrupted (ST03).

When the plasma etching process is interrupted due to an abnormality, the organic component attached to the inner wall of the chamber may volatilize in the chamber and attaches to the substrate 10 again during the interruption period. Since the organic component attached again to the substrate 10 inhibits the etching, it is necessary to remove the organic component attached to the substrate 10 before resuming the plasma etching.

(Cleaning Process)

When the cause of the abnormality has been removed, and the plasma etching process is in a ready state to be resumed, the cleaning process is performed (ST04). In the cleaning process, an oxidizing gas is supplied into the chamber. The substrate is exposed to a plasma containing the oxidizing gas, and the organic component attached to the substrate are decomposed and removed.

The oxidizing gas preferably includes oxygen gas ($O_2$) and/or ozone ($O_3$). In addition to the oxygen gas, an inert gas, such as argon (Ar), or an oxygen compound may be contained. Examples of the oxygen compound include at least one selected from the group consisting of $H_2O_2$, $H_2O$, $CO_x$, $SO_x$, $NO_x$, and $N_2O$, where x is an integer of one or more.

The following is an example of the conditions for generating a plasma in the cleaning process, but the conditions are not limited thereto and can be changed variously.

Supply gas: Oxygen ($O_2$) gas
Flow rate: 100 sccm
Total pressure: 1.0 Pa
Power applied to ICP coil: 3000 W
Bias power: 50 W
Processing time: 60 s When the cleaning process is completed, the plasma etching process is resumed (ST05). When an abnormality is detected in the resumed plasma etching process ST05, the process ST05 is interrupted again, and the process returns to the cleaning process ST04, to repeat the processes ST04 and ST05.

In the plasma etching process ST02 and the plasma etching process ST05 resumed after the interruption, the conditions for generating a plasma for etching the semiconductor layer are set according to the material of the semiconductor layer and the like.

The following is an example of the conditions for generating a plasma in each of (i) protective film deposition step, (ii) protective film removal step, and (iii) semiconductor layer bottom etching step, when the semiconductor layer contains silicon (Si) and the Bosch process is adopted in the plasma etching processes ST02 and ST05. It is to be noted, however, that the conditions are not limited thereto and can be changed variously.

(i) Protective Film Deposition Step
Supply gas: $C_4F_8$ gas
Flow rate: 150 to 250 sccm
Total pressure: 15 to 25 Pa
Power applied to ICP coil: 1500 to 2500 W
Bias power: 0 to 50 W
Processing time: 2 to 15 s
(ii) Protective Film Removal Step
Supply gas: $SF_6$ gas
Flow rate: 200 to 400 sccm
Total pressure: 5 to 15 Pa
Power applied to ICP coil: 1500 to 2500 W
Bias power: 300 to 1000 W
Processing time: 2 to 10 s
(iii) Bottom Etching Step
Supply gas: $SF_6$ gas
Flow rate: 200 to 400 sccm
Total pressure: 5 to 15 Pa
Power applied to ICP coil: 1500 to 2500 W
Bias power: 50 to 5000 W
Processing time: 10 to 20 s (Plasma Processing Apparatus)

Figure 3:
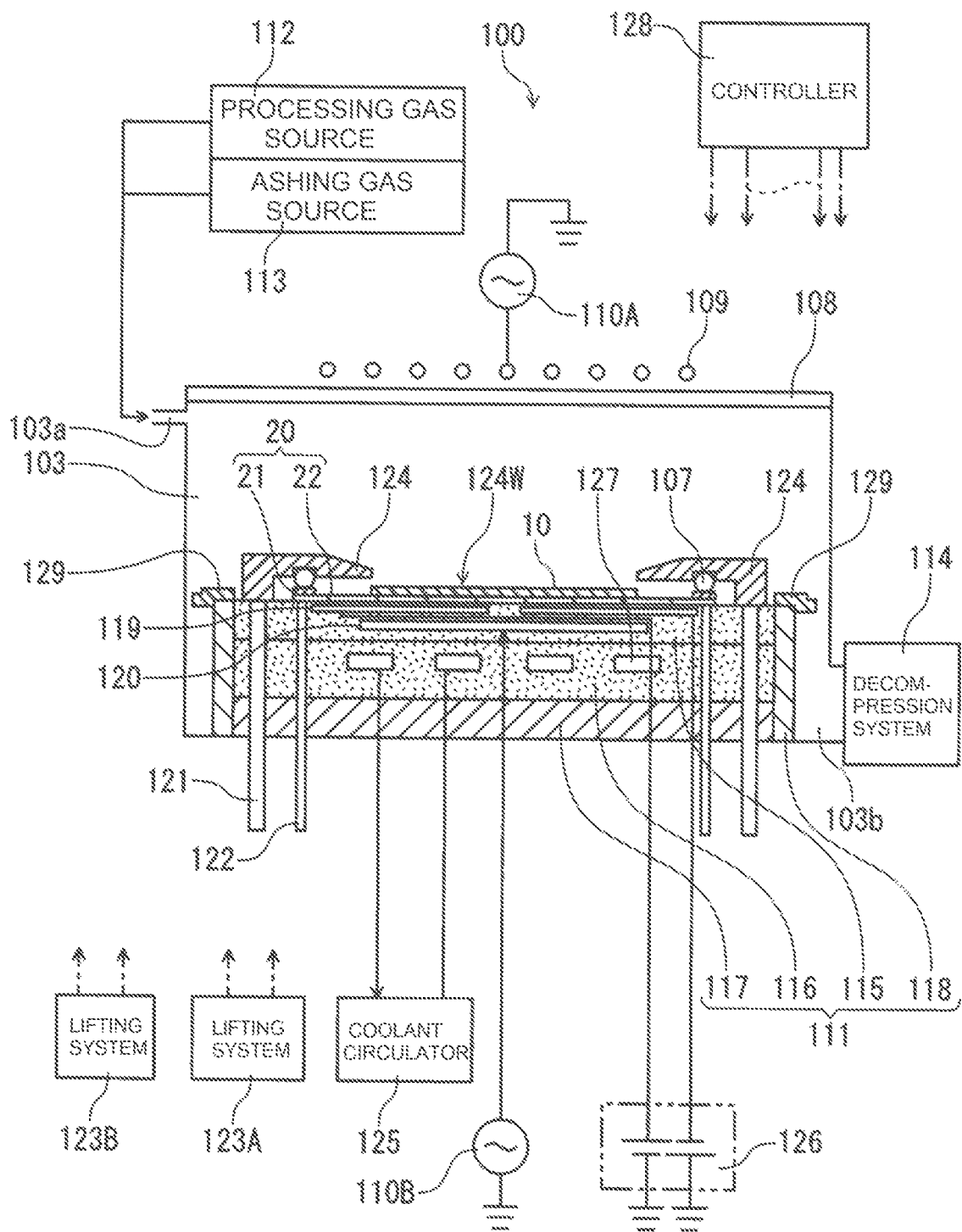
FIG. 3 is a schematic cross-sectional structure diagram of an example of a plasma processing apparatus used in a plasma processing method according to an embodiment of the present invention.

FIG. 3 shows an exemplary configuration of a plasma processing apparatus used in a plasma processing method according to an embodiment of the present invention.

A plasma processing apparatus 100 includes a stage 111. A work piece (conveying carrier) 20 is mounted on the stage 111, with the surface with the substrate 10 held thereon of the holding member 22 faced upward. The stage 111 has such a size that the whole work piece 20 can be seated thereon. Above the stage 111, a cover 124 having a window 124W for exposing at least part of the substrate 10 therefrom is arranged. The cover 124 is provided with pressure members 107 for pressing the frame 21 downward while the frame 21 is on the stage 111. The pressure members 107 are preferably a member that can achieve point contact with the frame 21 (e.g., a coil spring or an elastic resin having elasticity). This can correct a distortion of the frame 21, while restricting a thermal communication between the frame 21 and the cover 124.

The cover 124 serves to cover the exposed portion of the holding member 22 of the work piece 20, to prevent the exposed portion from being exposed to plasma. In the example illustrated in FIG. 3, the entire surface of the exposed portion is substantially covered with the cover 124, and the exposed portion is prevented from being exposed to plasma. However, when the substrate 10 having an area which is smaller than expected relative to the frame 21 is attached to the holding member 22, the cover 124 cannot completely cover the exposed portion of the holding member 22 of the work piece 20, and the exposed portion is exposed to plasma. As a result, the organic component of the adhesive layer in the exposed portion scatters within the chamber and attaches to the inner wall of the chamber. When the plasma processing is interrupted, for example, upon detection of an abnormality, the organic component having scattered within the chamber or attached to the inner wall of the chamber may attach to the substrate 10.

When the plasma processing apparatus 100 is viewed from above, the distance between the inner periphery of the cover 124 and the outer periphery of the substrate 10 may be 10 mm or more. In this case, the area of the exposed portion not covered with the cover 124 is large, which means that the area of the exposed portion exposed to plasma is large. Thus, the amount of the organic component of the adhesive layer scattered within the chamber and that attached to the inner wall of the chamber increase remarkably. Moreover, the plasma can reach the exposed portion through the gap between the cover 124 and the substrate 10. When the plasma processing apparatus 100 is viewed from above, the distance between the inner periphery of the frame 21 and the outer periphery of the substrate 10 may be 30 mm or more. In this case, the area of the exposed portion exposed to the plasma directly or through the gap is large, and the amount of the organic component of the adhesive layer scattered within the chamber and that attached to the inner wall of the chamber increase remarkably. The plasma processing method of the present invention including the cleaning process is effective in the cases as above.

Note that, however, the larger the area of the exposed portion is, the more the amount of the organic component attached to the substrate 10 increases, leading to a longer time required to complete the cleaning process. In view of reducing the amount of the organic component of the adhesive layer attached to the substrate so as to be cleaned in a short time, the distance between the inner periphery of the cover 124 and the outer periphery of the substrate 10 may be 150 mm or less. Similarly, the distance between the inner periphery of the frame 21 and the periphery of the substrate 10 may be 180 mm or less.

The stage 111 and the cover 124 are arranged in a vacuum chamber 103. The vacuum chamber 103 is approximately cylindrical with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is disposed on the bottom side in the vacuum chamber 103.

The vacuum chamber 103 is provided with a gas inlet 103a and a gas outlet 103b. The gas inlet 103a is connected to plasma-generating gas (processing gas) supply sources, i.e., a processing gas source 112 and an ashing gas source 113, each through a conduit. The gas outlet 103b is connected to a decompression system 114 including a vacuum pump for exhausting the gas within the vacuum chamber 103, to reduce the pressure therein. While the vacuum chamber 103 is supplied with a processing gas, the first electrode 109 is applied with a high-frequency power from the first high-frequency power source 110A. This generates a plasma in the vacuum chamber 103.

The stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is disposed. The circumferential ring 129 serves to protect the top surface of the peripheral member 118 from plasma exposure. The electrode layer 115 and the circumferential ring 129 are formed of, for example, the dielectric material as mentioned above.

Within the electrode layer 115, an electrode for electrostatic chucking (hereinafter, ESC electrode 119), and a second electrode 120 electrically connected to a second high-frequency power source 110B are disposed. The ESC electrode 119 is electrically connected to a DC power source 126. The ESC electrode 119 and the DC power source 126 constitute an electrostatic chuck system. The electrostatic chuck system pulls the holding member 22 onto the stage 111 and secures it thereto. A clamp (not shown) may be used for securing the holding member 22 to the stage 111.

The metal layer 116 is formed of, for example, aluminum with an anodic oxidation coating. The metal layer 116 has a coolant channel 127 formed therein. The coolant channel 127 is configured to cool the stage 111. By cooling the stage 111, the holding member 22 set on the stage 111 is cooled down, and the cover 124 partially in contact with the stage 111 is also cooled down. This protects the substrate 10 and the holding member 22 from being damaged by being heated during plasma processing. A coolant in the coolant channel 127 is circulated by a coolant circulator 125.

Around the peripheral portion of the stage 111, a plurality of supporting rods 122 extending through the stage 111 are disposed. The supporting rods 122 support the frame 21 of the work piece 20. The supporting rods 122 are driven by a first lifting system 123A, and move upward and downward. The work piece 20 having delivered into the vacuum chamber 103 is passed onto the supporting rods 122 at a predetermined raised position. Then the supporting rods 122 descend until their top surfaces become flush with or lower than the top surface of the stage 111, which sets the work piece 20 at a predetermined position on the stage 111.

A plurality of lifting rods 121 are coupled to the peripheral edge of the cover 124, to lift and lower the cover 124. The lifting rods 121 are driven by a second lifting system 123B. The lifting and lowering operation of the cover 124 by the second lifting systems 123B can be controlled independently from the operation by the first lifting system 123A.

A controller 128 controls operations of component elements of the plasma processing apparatus 100 including the first high-frequency power source 110A, the second high-frequency power source 110B, the processing gas source 112, the ashing gas source 113, the decompression system 114, the coolant circulator 125, the first lifting system 123A, the second lifting system 123B, and the electrostatic chuck system.

INDUSTRIAL APPLICABILITY

The plasma processing method according to the present invention is applicable to a process for manufacturing a plurality of element chips by performing substrate individualization by plasma dicing, and particularly useful for performing substrate individualization using the same plasma processing apparatus with respect to substrates having different sizes.

REFERENCE NUMERALS

10: substrate
20: work piece (conveying carrier)
  21: frame
  22: holding member (dicing tap)
    22X: adhesive surface
    22Y: non-adhesive surface
100: plasma processing apparatus
  103: vacuum chamber
    103a: gas inlet
    103b: gas outlet
  108: dielectric member
  109: first electrode
  110A: first high-frequency power source
  110B: second high-frequency power source
  111: stage
  112: processing gas source
  113: ashing gas source
  114: decompression system
  115: electrode layer
  116: metal layer
  117: base table
  118: peripheral member
  119: ESC electrode
  120: second electrode
  121: lifting rod
  122: supporting rod
  123A, 123B: lifting system
  124: cover
    124W: window
  125: coolant circulator
  126: DC power supply
  127: coolant channel
  128: controller
  129: circumferential ring

What is claimed is:

1. A plasma processing method, comprising:
a process of placing, on a stage provided in a chamber, a work piece including a substrate and a holding member having an adhesive layer on a surface and holding the substrate via the adhesive layer, the work piece having an exposed portion where the adhesive layer is exposed outside the substrate; and
a plasma etching process of etching the substrate with a plasma generated in the chamber, with the exposed portion exposed to the plasma, wherein
in response to occurrence of an interruption in the plasma etching process, a cleaning process of exposing a surface of the substrate to a plasma containing an oxidizing gas is performed such that an organic component derived from the adhesive layer and attached to the substrate during the interruption is removed, and then the plasma etching process is resumed.

2. The plasma processing method according to claim 1, wherein the adhesive layer contains at least one selected from the group consisting of an epoxy resin and an acrylic resin.

3. The plasma processing method according to claim 1, wherein
the plasma etching process includes
(i) a protective film deposition step of forming a protective film on at least a sidewall of a groove formed in the substrate,
(ii) a protective film removal step for removing the protective film at a bottom of the groove, and
(iii) an etching step of etching the bottom of the groove, the steps (i) to (iii) being sequentially repeated, and
in response to occurrence of an interruption in one of the steps (i) to (iii), the cleaning process is performed, and then the plasma etching process is resumed from the step (i).

4. The plasma processing method according to claim 1, wherein
the substrate includes a semiconductor layer having a plurality of element regions and a dividing region defining the element regions, and a mask covering the semiconductor layer in the element regions and exposing the semiconductor layer in the dividing region, and
in the plasma etching process, a groove is formed along the dividing region by etching the semiconductor layer exposed from the mask.

5. The plasma processing method according to claim 1, wherein in the plasma etching process, a temperature of the stage is lower than a temperature of an inner wall of the chamber.

6. A plasma processing method, comprising:
a process of placing, on a stage provided in a chamber, a work piece including a substrate and a holding member having an adhesive layer on a surface and holding the substrate via the adhesive layer, the work piece having an exposed portion where the adhesive layer is exposed outside the substrate; and
a plasma etching process of etching the substrate with a plasma generated in the chamber, with the exposed portion exposed to the plasma, wherein
in response to occurrence of an interruption due to an abnormality in the plasma etching process, a cleaning process of exposing a surface of the substrate to a plasma containing an oxidizing gas is performed, and then the plasma etching process is resumed.

7. The plasma processing method according to claim 6, wherein the occurrence of the abnormality is determined based on a value of a parameter observed in the etching process.

8. The plasma processing method according to claim 7, wherein the parameter includes at least one of a gas flow rate, a pressure, an electric power applied to an ICP coil and a bias power.

9. The plasma processing method according to claim 6, wherein in the cleaning process, an organic component derived from the adhesive layer and attached to the substrate during the interruption is removed.

* * * * *